United States Patent
Cheng et al.

(10) Patent No.: US 8,659,155 B2
(45) Date of Patent: Feb. 25, 2014

(54) MECHANISMS FOR FORMING COPPER PILLAR BUMPS

(75) Inventors: Ming-Da Cheng, Jhubei (TW);
Wen-Hsiung Lu, Jhonghe (TW);
Chih-Wei Lin, Xinfeng Township (TW);
Ching-Wen Chen, Hsinchu (TW);
Yi-Wen Wu, Xizhi (TW); Chia-Tung Chang, Junan Miao-Li Hsien (TW);
Ming-Che Ho, Tainan (TW); Chung-Shi Liu, Shin-Chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 332 days.

(21) Appl. No.: 12/846,353

(22) Filed: Jul. 29, 2010

(65) Prior Publication Data

US 2011/0101527 A1 May 5, 2011

Related U.S. Application Data

(60) Provisional application No. 61/258,393, filed on Nov. 5, 2009.

(51) Int. Cl.
*H01L 23/48* (2006.01)
(52) U.S. Cl.
USPC .............. 257/738; 257/737; 257/E23.068; 257/E21.508; 438/614
(58) Field of Classification Search
USPC ............. 257/738, 737, E23.069; 438/614
See application file for complete search history.

(56) References Cited

U.S. PATENT DOCUMENTS

| | | |
|---|---|---|
| 3,528,090 A | 9/1970 | Van Laer |
| 4,380,867 A | 4/1983 | Antson |
| 4,720,740 A | 1/1988 | Clements et al. |
| 4,811,082 A | 3/1989 | Jacobs et al. |
| 4,990,462 A | 2/1991 | Sliwa, Jr. |

(Continued)

FOREIGN PATENT DOCUMENTS

| | | |
|---|---|---|
| CN | 101651120 | 2/2010 |
| JP | 2125621 A | 5/1990 |

(Continued)

OTHER PUBLICATIONS

Notice of Allowance for corresponding Patent Application No. 10-2011-0011567 (English Translation Version and Korean Language Version).

(Continued)

*Primary Examiner* — Elias M Ullah
(74) *Attorney, Agent, or Firm* — Lowe Hauptman & Ham, LLP

(57) ABSTRACT

The mechanism of forming a metal bump structure described above resolves the delamination issues between a conductive layer on a substrate and a metal bump connected to the conductive layer. The conductive layer can be a metal pad, a post passivation interconnect (PPI) layer, or a top metal layer. By performing an in-situ deposition of a protective conductive layer over the conductive layer (or base conductive layer), the under bump metallurgy (UBM) layer of the metal bump adheres better to the conductive layer and reduces the occurrence of interfacial delamination. In some embodiments, a copper diffusion barrier sub-layer in the UBM layer can be removed. In some other embodiments, the UBM layer is not needed if the metal bump is deposited by a non-plating process and the metal bump is not made of copper.

25 Claims, 11 Drawing Sheets

(56) References Cited

U.S. PATENT DOCUMENTS

| | | |
|---|---|---|
| 5,075,253 A | 12/1991 | Sliwa, Jr. |
| 5,134,460 A | 7/1992 | Brady et al. |
| 5,380,681 A | 1/1995 | Hsu |
| 5,391,917 A | 2/1995 | Gilmour et al. |
| 5,466,635 A | 11/1995 | Lynch et al. |
| 5,481,133 A | 1/1996 | Hsu |
| 5,510,298 A | 4/1996 | Redwine |
| 5,747,881 A | 5/1998 | Hosomi et al. |
| 5,767,001 A | 6/1998 | Bertagnolli et al. |
| 5,998,292 A | 12/1999 | Black et al. |
| 6,002,177 A | 12/1999 | Gaynes et al. |
| 6,184,060 B1 | 2/2001 | Siniaguine |
| 6,187,678 B1 | 2/2001 | Gaynes et al. |
| 6,191,493 B1 | 2/2001 | Yasunaga et al. |
| 6,218,281 B1 | 4/2001 | Watanabe et al. |
| 6,229,216 B1 | 5/2001 | Ma et al. |
| 6,229,220 B1 | 5/2001 | Saitoh et al. |
| 6,232,563 B1 | 5/2001 | Kim et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,322,903 B1 | 11/2001 | Siniaguine et al. |
| 6,355,501 B1 | 3/2002 | Fung et al. |
| 6,426,556 B1 | 7/2002 | Lin |
| 6,434,016 B2 | 8/2002 | Zeng et al. |
| 6,448,168 B1 | 9/2002 | Rao et al. |
| 6,464,895 B2 | 10/2002 | Forat et al. |
| 6,465,892 B1 | 10/2002 | Suga |
| 6,472,293 B1 | 10/2002 | Suga |
| 6,492,198 B2 | 12/2002 | Hwang |
| 6,538,333 B2 | 3/2003 | Kong |
| 6,562,653 B1 | 5/2003 | Ma et al. |
| 6,570,248 B1 | 5/2003 | Ahn et al. |
| 6,576,493 B1 | 6/2003 | Hirano |
| 6,578,754 B1 | 6/2003 | Tung |
| 6,592,019 B2 | 7/2003 | Tung |
| 6,599,778 B2 | 7/2003 | Pogge et al. |
| 6,600,222 B1 | 7/2003 | Levardo |
| 6,607,938 B2 | 8/2003 | Kwon et al. |
| 6,639,303 B2 | 10/2003 | Siniaguine |
| 6,661,085 B2 | 12/2003 | Kellar et al. |
| 6,664,129 B2 | 12/2003 | Siniaguine |
| 6,693,361 B1 | 2/2004 | Siniaguine et al. |
| 6,731,003 B2 | 5/2004 | Joshi et al. |
| 6,740,582 B2 | 5/2004 | Siniaguine |
| 6,762,076 B2 | 7/2004 | Kim et al. |
| 6,770,958 B2 | 8/2004 | Wang et al. |
| 6,790,748 B2 | 9/2004 | Kim et al. |
| 6,800,930 B2 | 10/2004 | Jackson et al. |
| 6,818,545 B2 | 11/2004 | Lee et al. |
| 6,828,677 B2 | 12/2004 | Yap et al. |
| 6,841,883 B1 | 1/2005 | Farnworth et al. |
| 6,853,076 B2 | 2/2005 | Datta et al. |
| 6,869,831 B2 | 3/2005 | Cowens et al. |
| 6,879,041 B2 | 4/2005 | Yamamoto et al. |
| 6,882,030 B2 | 4/2005 | Siniaguine |
| 6,887,769 B2 | 5/2005 | Kellar et al. |
| 6,908,565 B2 | 6/2005 | Kim et al. |
| 6,908,785 B2 | 6/2005 | Kim |
| 6,917,119 B2 | 7/2005 | Lee et al. |
| 6,924,551 B2 | 8/2005 | Rumer et al. |
| 6,943,067 B2 | 9/2005 | Greenlaw |
| 6,946,384 B2 | 9/2005 | Kloster et al. |
| 6,958,539 B2 | 10/2005 | Lay et al. |
| 6,962,867 B2 | 11/2005 | Jackson et al. |
| 6,962,872 B2 | 11/2005 | Chudzik et al. |
| 6,975,016 B2 | 12/2005 | Kellar et al. |
| 7,008,867 B2 | 3/2006 | Lei |
| 7,012,333 B2 | 3/2006 | Shimoyama et al. |
| 7,030,481 B2 | 4/2006 | Chudzik et al. |
| 7,037,804 B2 | 5/2006 | Kellar et al. |
| 7,049,170 B2 | 5/2006 | Savastiouk et al. |
| 7,056,807 B2 | 6/2006 | Kellar et al. |
| 7,060,601 B2 | 6/2006 | Savastiouk et al. |
| 7,064,436 B2 | 6/2006 | Ishiguri et al. |
| 7,071,546 B2 | 7/2006 | Fey et al. |
| 7,087,538 B2 | 8/2006 | Staines et al. |
| 7,111,149 B2 | 9/2006 | Eilert |
| 7,122,912 B2 | 10/2006 | Matsui |
| 7,151,009 B2 | 12/2006 | Kim et al. |
| 7,157,787 B2 | 1/2007 | Kim et al. |
| 7,193,308 B2 | 3/2007 | Matsui |
| 7,215,033 B2 | 5/2007 | Lee et al. |
| 7,262,495 B2 | 8/2007 | Chen et al. |
| 7,271,497 B2 | 9/2007 | Joshi et al. |
| 7,276,799 B2 | 10/2007 | Lee et al. |
| 7,279,795 B2 | 10/2007 | Periaman et al. |
| 7,297,574 B2 | 11/2007 | Thomas et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,335,972 B2 | 2/2008 | Chanchani |
| 7,345,350 B2 | 3/2008 | Sinha |
| 7,348,210 B2 | 3/2008 | Daubenspeck et al. |
| 7,355,273 B2 | 4/2008 | Jackson et al. |
| 7,391,112 B2 | 6/2008 | Li et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,462,942 B2 | 12/2008 | Tan et al. |
| 7,494,845 B2 | 2/2009 | Hwang et al. |
| 7,501,311 B2 | 3/2009 | Tsai |
| 7,524,755 B2 | 4/2009 | Widodo et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,566,650 B2 | 7/2009 | Lin et al. |
| 7,576,435 B2 | 8/2009 | Chao |
| 7,592,246 B2 | 9/2009 | Akram |
| 7,648,899 B1 | 1/2010 | Banerji et al. |
| 7,825,511 B2 | 11/2010 | Daubenspeck et al. |
| 7,834,450 B2 | 11/2010 | Kang |
| 7,928,534 B2 | 4/2011 | Hsu et al. |
| 2001/0000321 A1 | 4/2001 | Takeda et al. |
| 2002/0014705 A1 | 2/2002 | Ishio et al. |
| 2002/0033531 A1 | 3/2002 | Matsushima et al. |
| 2003/0156969 A1 | 8/2003 | Choi et al. |
| 2003/0216025 A1 | 11/2003 | Lu et al. |
| 2004/0007779 A1 | 1/2004 | Arbuthnot et al. |
| 2004/0157450 A1 | 8/2004 | Bojkov et al. |
| 2004/0166661 A1 | 8/2004 | Lei |
| 2005/0001324 A1 | 1/2005 | Dunn et al. |
| 2005/0077624 A1 | 4/2005 | Tan et al. |
| 2005/0179131 A1 | 8/2005 | Homma |
| 2006/0043603 A1 | 3/2006 | Ranade et al. |
| 2006/0166402 A1 | 7/2006 | Lim et al. |
| 2006/0237842 A1 | 10/2006 | Shindo |
| 2006/0278982 A1 | 12/2006 | Solo |
| 2007/0023904 A1 | 2/2007 | Salmon |
| 2007/0080421 A1 | 4/2007 | Suh |
| 2007/0108606 A1 | 5/2007 | Watanabe |
| 2007/0222073 A1 | 9/2007 | Farooq et al. |
| 2007/0284684 A1 | 12/2007 | Naito et al. |
| 2007/0287279 A1 | 12/2007 | Daubenspeck et al. |
| 2008/0080113 A1* | 4/2008 | Lin et al. .................... 361/56 |
| 2008/0296764 A1 | 12/2008 | Chang et al. |
| 2009/0011543 A1 | 1/2009 | Karta et al. |
| 2009/0026608 A1 | 1/2009 | Tsai et al. |
| 2009/0045511 A1 | 2/2009 | Meyer et al. |
| 2009/0096109 A1 | 4/2009 | Iwasaki |
| 2009/0098724 A1 | 4/2009 | Yu |
| 2009/0130840 A1 | 5/2009 | Wang et al. |
| 2009/0197114 A1 | 8/2009 | Shih et al. |
| 2009/0229857 A1 | 9/2009 | Fredenberg et al. |
| 2010/0090318 A1 | 4/2010 | Hsu et al. |
| 2010/0109159 A1 | 5/2010 | Ho et al. |
| 2010/0230810 A1 | 9/2010 | Kang et al. |
| 2011/0101523 A1 | 5/2011 | Hwang et al. |
| 2011/0101526 A1 | 5/2011 | Hsiao et al. |
| 2011/0101527 A1* | 5/2011 | Cheng et al. .................. 257/738 |
| 2011/0156256 A1 | 6/2011 | Kang et al. |
| 2011/0186990 A1 | 8/2011 | Mawatari et al. |
| 2011/0227216 A1 | 9/2011 | Tseng et al. |

(56) References Cited

U.S. PATENT DOCUMENTS

| | | |
|---|---|---|
| 2011/0281432 A1 | 11/2011 | Farooq et al. |
| 2011/0291267 A1 | 12/2011 | Wang et al. |
| 2012/0126419 A1 | 5/2012 | Kripesh et al. |

FOREIGN PATENT DOCUMENTS

| | | |
|---|---|---|
| JP | 1993335313 | 12/1993 |
| JP | 2000228420 | 8/2000 |
| JP | 2004048012 A | 12/2004 |
| KR | 20020027946 A | 4/2002 |
| KR | 20080052169 A | 6/2008 |
| WO | 2004004003 A1 | 1/2004 |

OTHER PUBLICATIONS

Korean Office Action for corresponding Application No. 10-2011-0011567, with an English Translation.
Chinese Office Action for corresponding Application No. 201010569645.9 (Chinese Language).
U.S. Appl. No. 61/258,414, filed Nov. 5, 2009, Chien Ling Hwang, et al.
U.S. Appl. No. 61/238,749, filed Sep. 1, 2009, Chung-Shi Liu.
U.S. Appl. No. 61/258,393, filed Nov. 5, 2009, Chien Ling Hwang, et al.
U.S. Appl. No. 61/230,012, filed Jul. 30, 2009, Chung-Shi Liu, et al.
Kim, K. S., et al., "The Interface Formation and Adhesion of Metals (Cu, Ta, and Ti) and Low Dielectric Constant Polymer-Like Organic Thin Films Deposited by Plasma-Enhanced Chemical Vapor Deposition Using Para-Xylene Precursor", Thin Solid Films 377-378 (2000), pp. 122-128.
Kim, K. J., et al., "Chemical Interaction, Adhesion and Diffusion Properties at the Interface of Cu and Plasma-Treated Thiophene-Based Plasma Polymer (ThioPP) Films", Thin Solid Films 398-399 (2001), pp. 657-662.
Du, M., et al., "The Interface Formation of Copper and Low Dielectric Constant Fluoro-Polymer: Plasma Surface Modification and its Effect on Copper Diffusion", Journal of Applied Physics, vol. 85, No. 3, Feb. 1, 1999, pp. 1496-1502.
Jiang, Liang-You, et al., "Reduced Copper Diffusion in Layered Silicate/Fluorinated Polyimide (6FDS-ODA) Nanocomposites", Journal of Applied Polymer Science, vol. 92, 1422-1425 (2004).
Office Action dated Jun. 5, 2013 from corresponding application No. CN 201010569645.9.

* cited by examiner

MECHANISMS FOR FORMING COPPER PILLAR BUMPS

CROSS REFERENCES TO RELATED APPLICATIONS

The present application is related to U.S. provisional Application No. 61/258,393, entitled "Copper Pillar Bump with Barrier Layer for Reducing The Thickness of Intermetallic Compound," filed on Nov. 5, 2009, and U.S. application Ser. No. 12/702,636, entitled "Semiconductor Device And Semiconductor Assembly With Lead-Free Solder," filed on Feb. 9, 2010. Both above-mentioned applications are incorporated herein by reference in its entirety.

FIELD

This disclosure relates to the fabrication of integrated circuit devices, and more particularly, to the fabrication of bump structures in integrated circuit devices.

BACKGROUND

Modern integrated circuits are made of literally millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding.

Flip-chip packaging utilizes bumps to establish electrical contact between a chip's I/O pads and the substrate or lead frame of the package. Structurally, a bump actually contains the bump itself and a so-called under bump metallurgy (UBM) layer located between the bump and an I/O pad. Recently, copper pillar bump technology has emerged. Instead of using solder bump, an electronic component is connected to a substrate by means of copper pillar bumps, which achieve finer pitches with minimum probability of bump bridging, reduces the capacitance load for the circuits, and allows the electronic component to perform at higher frequencies. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

Figure 1A:
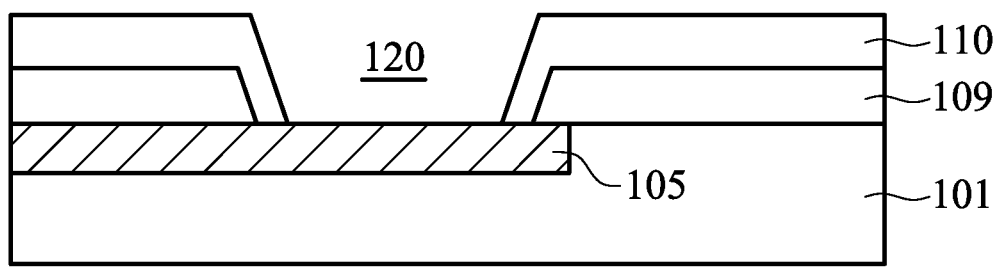
FIGS. 1A-1D illustrate cross-sectional diagrams of a Cu pillar bump process, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIGS. 1A-1D illustrate cross-sectional diagrams of structures undergoing bump processes, in accordance with some embodiments. The bumps themselves, based on the material used, are classified as solder bumps, gold bumps, copper pillar bumps and bumps with mixed metals. FIG. 1A shows a bump fabrication region 100, in accordance with some embodiments. The bump fabrication region 100 is formed on a semiconductor substrate 101. The semiconductor substrate 101 is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 101 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 101 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Substrate 101 may also include inter-layer dielectric layers and a metallization structure overlying the integrated circuits.

The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers.

FIG. 1A shows a conductive layer 105 formed on a substrate 101. The conductive layer 105 can be a metal pad, a post passivation interconnect (PPI) layer, or a top metal layer, in accordance with some embodiments. A metal pad provides input/output (I/O) electrical contact to interconnect and devices underneath. In some embodiments, the metal pad also provide redistribution (or re-route) of metal interconnect. In a post passivation interconnect (PPI) process, contact pads and other conductors are fabricated on top of the passivation layer (not shown) and are connected to the contact regions of the integrated circuit in substrate 101. PPI can be used to re-route the connections to integrated circuit to facilitate contact to the package.

The material used for the conductive layer 105 may include, but not limited to, for example copper, aluminum, copper alloy, or other mobile conductive materials. If the conductive layer 105 is made of copper, there is a copper diffusion barrier layer (not shown) encasing the conductive layer 105 to prevent Cu from diffusing to device regions of substrate 101. The exemplary materials that can be used for copper diffusion barrier may include titanium, titanium nitride, tantalum, tantalum nitride, and combinations thereof.

The conductive layer 105 may be formed by electrochemical plating, electroless plating, sputtering, chemical vapor deposition (CVD), and the like. If a plating process is used to deposit conductive layer 105 made of copper, a copper seed layer (not shown) can be used to increase copper plating rate and quality. In some embodiments, the copper seed layer is deposited by sputtering or CVD process. The conductive layer 105 connects the metal interconnects underneath to bump features. The conductive layer 105 may a function as power lines, and re-distribution lines (RDL). Further, the conductive layer 105 may also function as inductors, capacitors or any passive components. Metal layer 105 may have a thickness less than about 30 μm, for example between about 2 μm and about 25 μm.

Next, a dielectric layer 109, also referred to as an isolation layer or a passivation layer, is formed on the substrate 101 and the conductive layer 105. The dielectric layer 109 may be formed of dielectric materials such as silicon nitride, silicon carbide, silicon oxynitride or other applicable materials. The formation methods include plasma enhance chemical vapor deposition (PECVD) or other commonly used CVD methods. In some embodiments, the dielectric layer 109 is optional. For example, if the conductive layer 105 is a PPI layer, the dielectric layer 109 is not needed, since a passivation layer is already deposited under the PPI layer. After the dielectric layer 109 is patterned, a polymer layer 110 is deposited. Following the deposition of the polymer layer 110, another lithographical process and another etching process are performed to pattern the polymer layer 110. As a result, an opening 120 is formed to pass through the polymer layer 110 and the dielectric layer 109 and expose a portion of the conductive layer 105 for allowing subsequent bump process. Although the sidewalls of layers 109 and 110 are drawn to be slanted in FIG. 1A, the sidewalls of layers 109 and/or 110 can be substantially vertical in some embodiments.

The polymer layer 110, as the name suggests, is formed of a polymer, such as an epoxy, polyimide, benzocyclobutene (BCB), polybenzoxazole (PBO), and the like, although other relatively soft, often organic, dielectric materials can also be used. In some embodiments, the polymer layer 110 is a polyimide layer. In some other embodiments, the polymer layer 110 is a polybenzoxazole (PBO) layer. The polymer layer 110 is soft, and hence has the function of reducing inherent stresses on respective substrate. In addition, the polymer layer 110 is easily formed to thickness of tens of microns.

Figure 1B:
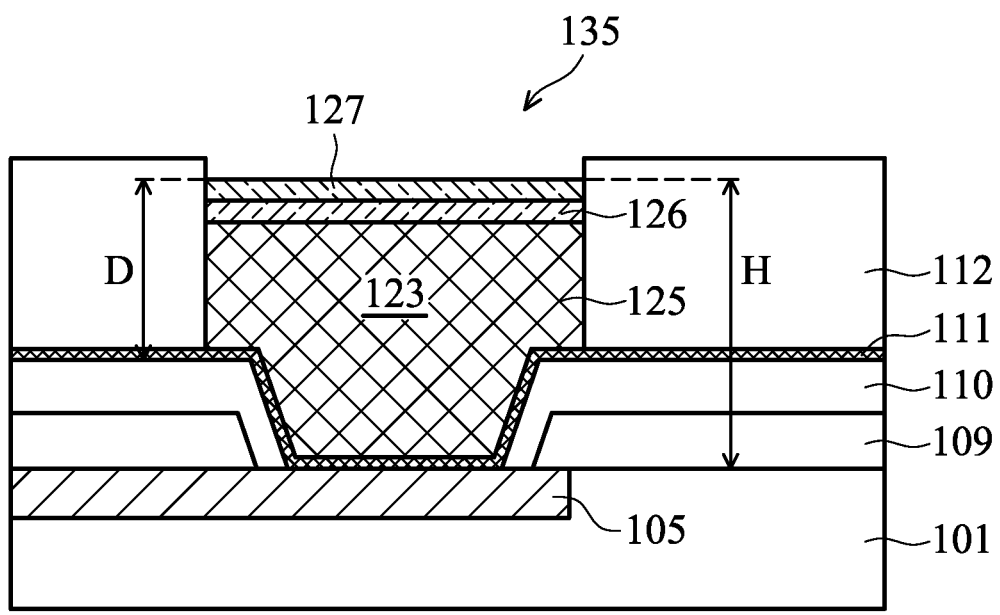

Referring to FIG. 1B, an under-bump-metallurgy (UBM) layer 111 is formed on the resulted structure of FIG. 1A. In some embodiments, the UBM layer includes a diffusion barrier layer and a seed layer. The UBM layer 111 is formed on the polymer layer 110 and the exposed portion of the conductive layer 105, and lines the sidewalls and bottom of the opening 120. The diffusion barrier layer may also function as an adhesion layer (or a glue layer), in some embodiments. The diffusion barrier layer is formed to cover the sidewalls and the bottom of the opening 120. The diffusion barrier layer may be formed of tantalum nitride, although it may also be formed of other materials such as titanium nitride, tantalum, titanium, or the like. The thickness of the diffusion barrier layer is in a range between about 500 Å to about 5000 Å, in some embodiments. In some embodiments, the formation methods include physical vapor deposition (PVD) (or sputtering). The seed layer may be a copper seed layer formed on the diffusion barrier layer. The copper seed layer may be formed of copper or one of copper alloys that include silver, chromium, nickel, tin, gold, and combinations thereof. The thickness of the copper seed layer is in a range between about 2000 Å to about 8000 Å, in some embodiments. In some embodiments, the UBM layer 111 includes a diffusion barrier layer formed of Ti and a seed layer formed of Cu. In some embodiments, both the diffusion barrier layer, such as a Ti layer, and the seed layer, such as a Cu layer, are deposited by physical vapor deposition (PVD) (or sputtering) methods.

Next, a mask layer 122 is provided on the UBM layer 111 and patterned with an opening 123 exposing a portion of the UBM layer 111 for Cu pillar bump formation. In some embodiments, the opening 123 is over the opening 120. In some other embodiments, the diameter of the opening 123 is greater or equal to the diameter of the opening 120. In some embodiments, the size of the opening 123 is between about 5 μm to about 100 μm. The mask layer 112 may be a dry film or a photoresist film. The opening 123 is then partially or fully filled with a conductive material with solder wettability. In an embodiment, a metal layer 125 is formed in the opening 123 to contact the underlying UBM layer 111. The metal 125 protrudes above the surface of the polymer layer 110 with a thickness "D". In some embodiments, the thickness "D" is between about 5 μm to about 100 μm. Other types of metal with high conductivity may also be used to fill opening 123, instead of Cu.

In some embodiments, the metal layer 125 is made of copper. As used throughout this disclosure, the term "copper (Cu) layer" is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. For example, electro-chemical plating (ECP) is carried out to form the Cu metal layer 125. In some embodiments, the thickness of the Cu metal layer 125 is greater than 30 um. In some other embodiments, the thickness of the Cu metal layer is greater than 40 um. In some embodiments, the thickness of Cu metal layer 125 (thickness H as shown in FIG. 1B) is about 40~50 µm. In some other embodiments, the thickness of Cu metal layer 125 is about 40~70 µm. In yet some other embodiments, the thickness of Cu metal layer 125 is about 2~150 µm.

In some other embodiments, the metal layer 125 is made of solder. The solder metal layer 125 may be made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. The formation methods may include sputtering, printing, electro plating, electroless plating, and commonly used chemical vapor deposition (CVD) methods. For example, electro-chemical plating (ECP) is carried out to form the solder metal layer 125. In some embodiments, the thickness of the solder metal layer 125 is greater than 30 um. In some other embodiments, the thickness of the solder metal layer is greater than 40 um. In some embodiments, the thickness of solder metal layer 125 (thickness H as shown in FIG. 1B) is about 40~50 µm. In some other embodiments, the thickness of solder metal layer 125 is about 40~70 µm. In yet some other embodiments, the thickness of solder metal layer 125 is about 2~150 µm.

Afterwards, a cap layer 126 is formed on the top surface of the Cu metal layer 125, in accordance with some embodiments. The cap layer 126 could act as a barrier layer to prevent copper in the Cu pillar 125 from diffusing into a bonding material, such as solder alloy, that is used to bond the substrate 101 to external features. The prevention of copper diffusion increases the reliability and bonding strength of the package. The cap layer 126 may include nickel, tin, tin-lead (SnPb), gold (Au), silver, palladium (Pd), indium (In), nickel-palladium-gold (NiPdAu), nickel-gold (NiAu), other similar materials, or alloy. In some embodiments, the cap layer 126 is a nickel layer with a thickness about 1µ5 µm. In some embodiments, the cap layer 126 is formed by plating.

Afterwards, a solder layer 127 is formed on the cap layer 126, in accordance with some embodiments. The solder layer 127 may be lead-free or may contain lead. The solder layer 127 and the cap layer 126 may for a eutectic alloy, in some embodiments. The solder layer 127, the cap layer 126, and the Co pillar 125 are referred to as a bump structure 135 formed over the conductive layer 105. The solder layer 127 may be formed by plating. In some embodiments, the solder layer 127 is formed as solder ball on the cap layer 126. In some other embodiments, the solder layer 127 is a plated solder layer on the cap layer 126. For a lead-free solder system, the solder layer 127 is SnAg with Ag content being controlled lower than 1.6 weight percent (wt %), in accordance with some embodiments. FIG. 1B shows that both the solder layer 127 and the cap layer 126 are plated in the opening formed by photoresist 112.

Figure 1C:
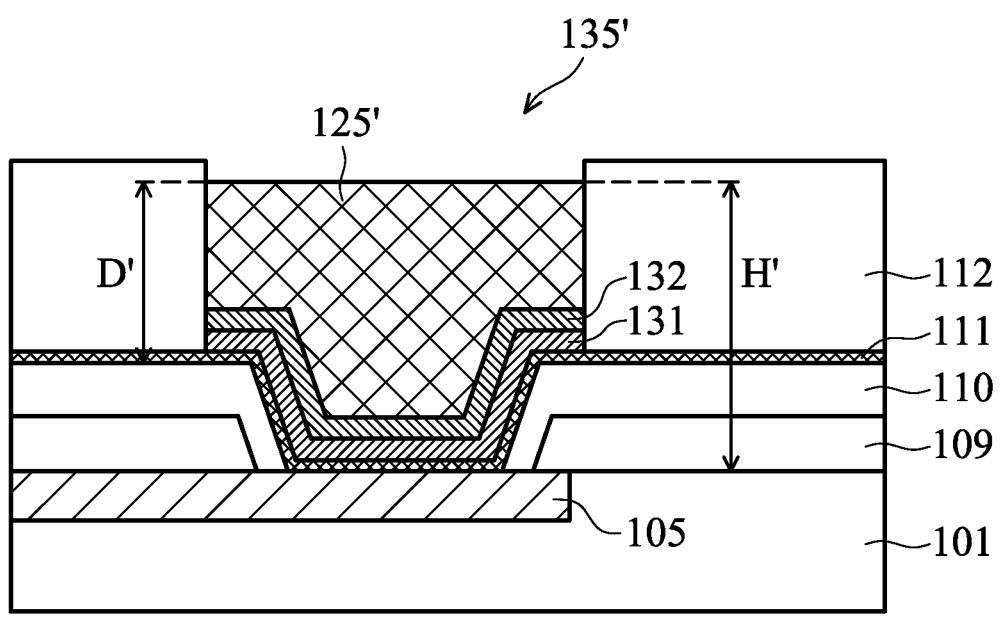

If the metal layer 125 is made of solder, the cap layer 126 and the lead-free solder layer 127 might not be needed. Further, if the metal layer 125 is made of solder, there may be additional layers between the UBM layer 111 and the metal layer 125. In some embodiments, a copper layer 131 and a diffusion barrier layer (a Ni layer) 132 are deposited on the UBM layer before the deposition of the solder metal layer 125', as shown in FIG. 1C. The solder metal layer 125' may be made of a solder that contains lead or a solder that is lead-free. The copper layer 131 is added to reduce resistivity and the diffusion barrier layer (Ni layer) 132 is added to prevent the diffusion of copper in the copper layer 131 into the solder metal layer 125'. In addition, the copper diffusion barrier may function as an adhesive layer and may also forms eutectic alloy with solder. In some embodiments, the diffusion barrier layer 132 may be made of nickel, tin, tin-lead (SnPb), gold (Au), silver, palladium (Pd), indium (In), nickel-palladium-gold (NiPdAu), nickel-gold (NiAu), other similar materials, or alloy.

In some embodiments, the thickness of the copper layer 131 is between about 1 µm to about 10 µm. The thickness of the nickel layer 132 is between about 0.5 µm to about 5 µm. The copper layer 131 and the nickel layer 132 can be deposited by various methods, such as sputtering, chemical vapor deposition, and plating. The copper layer 131 and the nickel layer 132 in FIG. 1C are deposited by plating processes. The solder metal 125' protrudes above the surface of the polymer layer 110 with a thickness D'. In some embodiments, the thickness D' is between about 5 µm to about 100 µm. The height of the metal pillar bump 135' is H', as shown in FIG. 1B. In some embodiments, the height H' is between about 5 µm to about 100 µm.

Figure 1D:
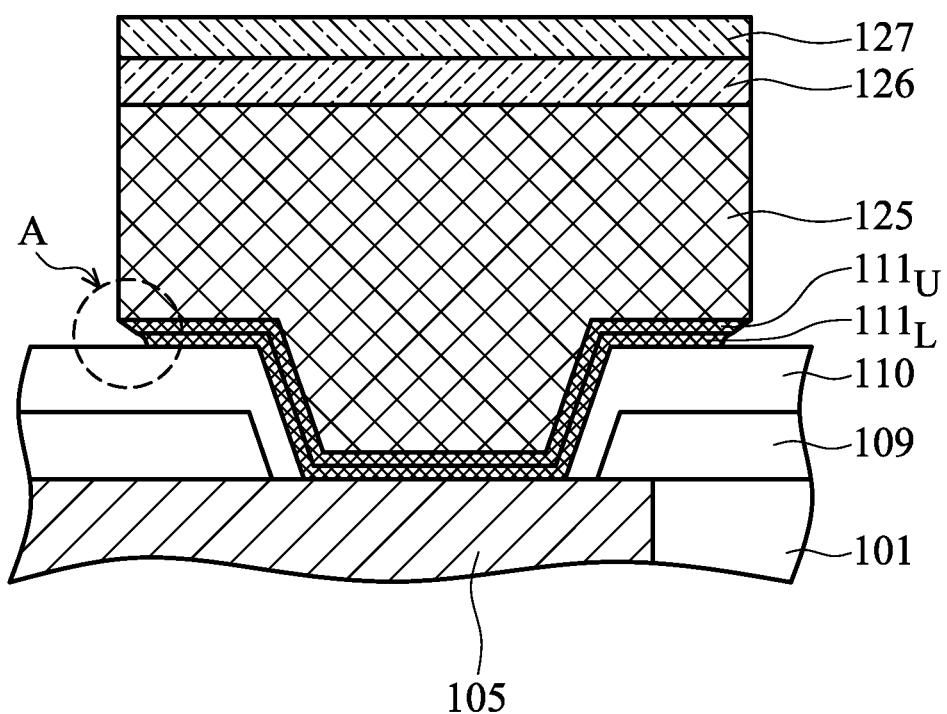

Next, as shown in FIG. 1D, the mask layer 112 is removed (referring back to the structure of FIG. 1B), exposing a portion of the UBM layer 111 outside the metal layer 125 (and the cap layer 126 and lead-free solder layer 127). In the case the mask layer 112 is a dry film, it may be removed using an alkaline solution, in accordance with some embodiments. If the mask layer 112 is formed of photoresist, it may be removed using acetone, n-methylpyrrolidone (NMP), dimethyl sulfoxide (DMSO), aminoethoxy ethanol, and the like, in accordance with some embodiments. Then the exposed portion of the UBM layer 111 is etched to expose the underlying polymer layer 110 outside the metal layer 125, thus the UBM layer 111 underlying the metal layer 125 remains. If the metal layer 125 is made of Cu, the remaining metal layer 125 can also be referred to as a Cu pillar bump layer. The process of removing the UBM layer 111 can be a dry etching or a wet etching. In some embodiments, an isotropic wet etching (often referred to as flash etching due to its short duration) using an ammonia-based acid is employed. A pillar bump 135 is formed after the UBM layer etching. The pillar bump includes the metal pillar bump layer 125, the UBM layer 111, the cap layer (if applicable), and the lead-free solder layer 127 (if applicable). As mentioned above, if the metal layer 125 is made of solder, the cap layer 126 and the lead-free solder layer 127 might not be needed. The height of the metal pillar bump 135 is "H", as shown in FIG. 1B. In some embodiments, the height "H" is between about 5 µm to about 100 µm.

If an isotropic wet etching is used to remove the exposed portion of the UBM layer 111, during the isotropic wet etching, a portion of the UBM layer 111 under Cu pillar bump 125 can be etched away (or undercut). As mentioned above, the UBM layer 111 can be formed of a diffusion barrier layer Ti layer ($111_L$) and a seed layer Cu (layer $111_U$), as shown in FIG. 1D in accordance with some embodiments. To etch the exposed UBM layer 111, one or more wet etching chemistries could be needed to remove the exposed Cu layer ($111_U$) and the exposed Ti layer ($111_L$). As mentioned above, an isotropic wet etching (often referred to as flash etching due to its short duration) using an ammonia-based acid could be employed, in accordance with some embodiments.

To ensure complete removal of exposed Cu layer ($111_U$) and Ti layer ($111_L$), overetching could be required. Overetching by wet etching chemistry(ies) leads to undercut, as shown in region A of FIG. 1D in accordance with some embodiments. In addition to providing the function of diffusion barrier layer, the Ti layer ($111_L$) also acts as an adhesion-promoting layer (or adhesion layer). With the Ti layer ($111_L$) being undercut, the burden of providing adhesion function falls on the remaining Ti layer ($111_L$) under metal pillar bump 135. As a result, the stress between the Ti layer ($111_L$) and the conductive layer 105 is increased. The increased stress could lead to delamination between the UBM layer 111 and the conductive layer 105. For example, if the conductive layer 105 is made of aluminum, Ti/Al-pad interfacial delamination can occur due to severe Ti layer ($111_L$) undercut causing extra stress at the interface.

One way to resolve the Conductive-layer/adhesion-barrier-layer interfacial delamination issue is to improve the adhesion quality between the conductive Layer 105, which can be a metal-pad or a PPI, and the lower UBM layer $111_L$, which could an adhesion layer, such as Ti layer ($111_L$). As shown in the exemplary process flow of making metal pillar bump involving FIGS. 1A-1C, after the conductive layer 105 is formed, the Ti adhesion layer ($111_L$, or barrier layer) is not deposited until dielectric layer 109 and polymer layer 110 are formed and etched. The surface of the conductive layer 105 is oxidized when it is exposed to air, and water. For example, if the conductive layer 105 is made of aluminum, the surface aluminum is oxidized to become aluminum oxide (or alumina) after being exposed to air or water. After the Al conductive layer 105 is deposited and is removed from the vacuum deposition chamber (such as a PVD chamber), the surface aluminum starts to form aluminum oxide. The aluminum oxide could be removed, at least partially, during etching of dielectric layer 109 and polymer layer 110. However, the fresh aluminum surface can oxidize to form aluminum oxide again. If the delay (or queue time) between the etching of polymer layer 110 and the deposition of Ti barrier/adhesion layer $111_L$, the surface of Al conductive layer 105 is covered by aluminum oxide. The adhesion between Ti and aluminum oxide ($Al_2O_3$) is worse than the adhesion between Ti and aluminum (Al) and might not withstand the extra stress caused by loss of Ti adhesion/diffusion-barrier layer due to undercut.

Figure 2A:
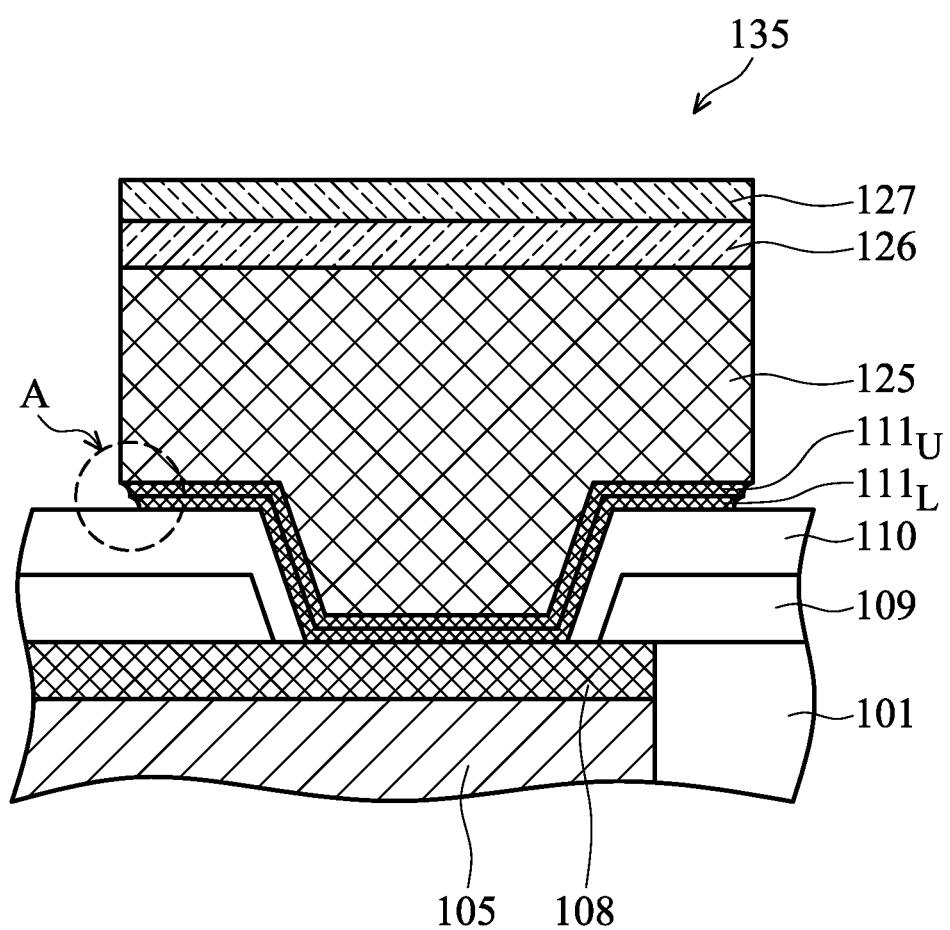
FIG. 2A shows a protective layer deposited over a conductive layer, in accordance with some embodiments.

To improve the adhesion quality between conductive layer 105, such as the metal pad or PPI, and the UBM layer 111, such as a Ti layer $111_L$, a conductive protective layer that adheres well to both the conductive layer 105 and the lower UBM layer 111, can be deposited in-situ in the same system right after the deposition of the conductive layer 105. FIG. 2A shows a protective layer 108 deposited over the conductive layer 105 using the same vacuum system (or in-situ) used to deposit the conductive layer 105, in accordance with some embodiments. The protective layer 108 is made of a conductive material. In some embodiments, the proactive layer 108 either oxidizes at a slower rate than the conductive layer 105 or whose oxide adheres well with the UBM layer (or the lower UBM layer $111_L$). If the conductive line 105 is made of copper, aluminum, copper alloy, aluminum alloy, or other mobile conductive materials, the protective layer can be made of Ta, TaN, Ti, TiN, or combination thereof. For example, Ta, TaN, Ti, or TiN oxidizes at a lower rate than Al, and itself, and its oxide adheres well UBM lower layer $111_L$ also made of materials, such as Ta, TaN, Ti, or TiN, or combination thereof. Other suitable materials can also be used. If the conductive layer 105 contains copper, the protective layer 108 also serves as a copper diffusion barrier.

The in-situ deposition (either in the same chamber or in separate chambers connected to a transfer chamber under vacuum) of the protective layer 108 over the conductive layer 105 prevents the conductive layer 105 from being exposed to oxygen to be oxidized. The conductive protective layer 108 is exposed to air and water during subsequent processing instead of the conductive layer 105. In some embodiments, the conductive protective layer 108 oxides at a rate relatively slower than the conductive layer 105. For example, Ti oxidizes at a slower rate than Al when exposed to air or water. In some other embodiments, the oxidized protective layer 108, such as titanium oxide, titanium oxynitride, tantalum oxide, tantalum oxynitride, etc., adheres better to the lower UBM layer $111_L$ than the conductive layer 105. The strong bonding between the proactive layer 108 and the lower UBM layer $111_L$ prevents interface delamination, which could have occurred under additional stress due to undercut of lower UBM layer $111_L$ in region A of FIG. 2A. In some embodiments, the thickness of the conducting protective layer 108 is between 1000 Å (angstroms) to 2000 Å.

The process flow for creating the structure shown in FIG. 2A is similar to the process flow for creating the structure of FIG. 1D, as described in process operations for FIGS. 1A-1D. The difference is the addition of an extra in-situ deposition of protective layer 108 immediately after the deposition of conductive layer 105.

As mentioned above, the lower UBM layer $111_L$ may be formed of titanium, titanium nitride, tantalum, tantalum nitride, or a combination of above-mentioned materials. Since the protective layer 108 uses the same material as the lower UBM layer $111_L$, the lower UBM layer $111_L$ can possibly be skipped to simplify the process flow. To skip the deposition of the lower UBM layer $111_L$, the upper UBM layer (Cu seed layer) needs to adhere well to the polymer layer 110. In addition, the concerns of copper diffusion from metal pillar bump 135 (or 135') and/or copper seed layer $111_U$ need to be resolved.

Figure 2B:
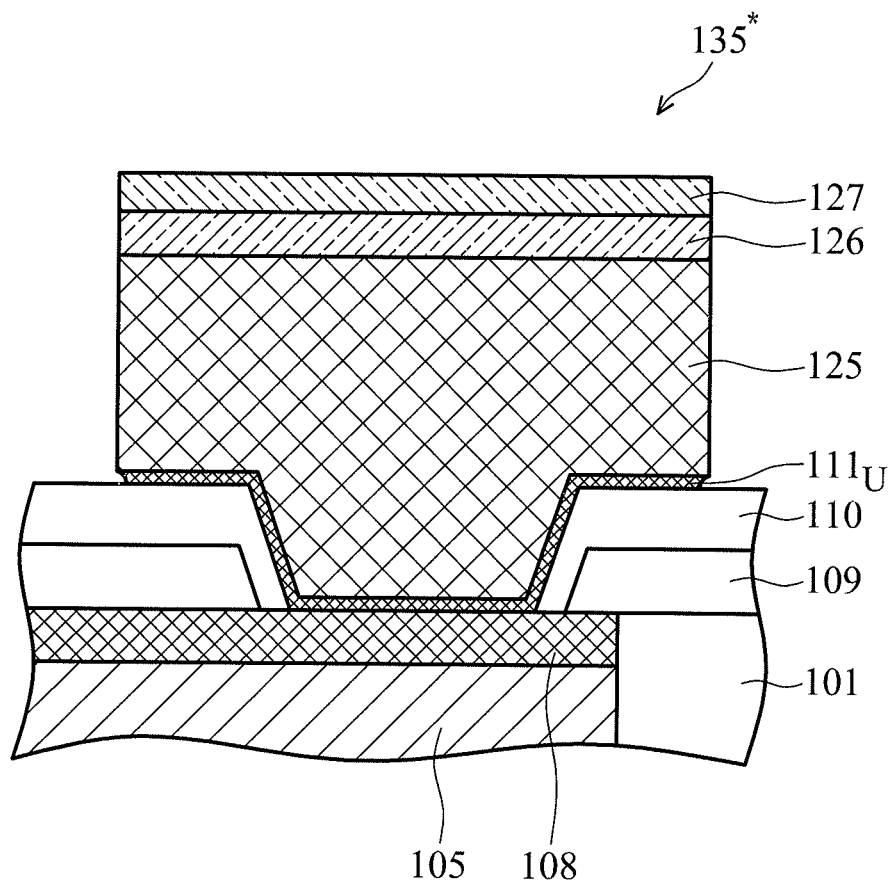
FIG. 2B shows a cross section of the same region of FIGS. 1D and 2A without the lower UBM layer, in accordance with some embodiments.

FIG. 2B shows a cross section of the same region of FIGS. 1D and 2A without the lower UBM layer $111_L$, in accordance with some embodiments. In the example of FIG. 2B, the metal layer 125 is made of copper. The Cu pillar bump 135* in FIG. 2B includes the Cu metal layer (or Cu pillar bump layer) 125 and the upper UBM layer $111_U$ (or copper seed layer $111_U$). As described above, the copper seed layer $111_U$ adheres well with the protective layer 108, and the seed layer $111_U$ may be made of copper, copper alloys that include silver, chromium, nickel, tin, gold, and combinations thereof. In addition to adhering well to the protective layer 108, the seed layer $111_U$ also needs to adhere well to the polymer layer 110 to reduce the interfacial stress of Cu pillar bump 135*. Studies show that copper can form Cu-polyimide complexes with polyimides containing riazole or imidazole functionalities and has good adhesion with such polyimides. An example of a polyimide that have good adhesion with Cu is poly(4,4'-oxydiphthalic anhydride-1,3-aminophenoxybenzene-8-azaadenine) (ODPA-APB-8-azaadenine). Studies also show that plasma treatment of polymers, such as polyimides, can increase the reactivity of Cu with the surface of the plasma-treated polyimide to cause crosslinking of the surface polymer. Therefore, the adhesion between copper and a plasma-treated polyimide is not an issue. The crosskicked polyimide polymers also create a barrier to copper diffusion. In some embodiments, the plasma used to treat the polyimide surface includes oxygen, nitrogen, or a combination of both gases. Therefore, with proper choice of materials for polymer layer 110 to increase adhesion between the polymer layer 110 and the Cu seed layer, and with plasma treatment of the polymer layer 110 to prevent Cu out-diffusion, a single Cu seed layer as the UBM layer 111 without the adhesion layer $111_L$ is possible.

Figure 2C:
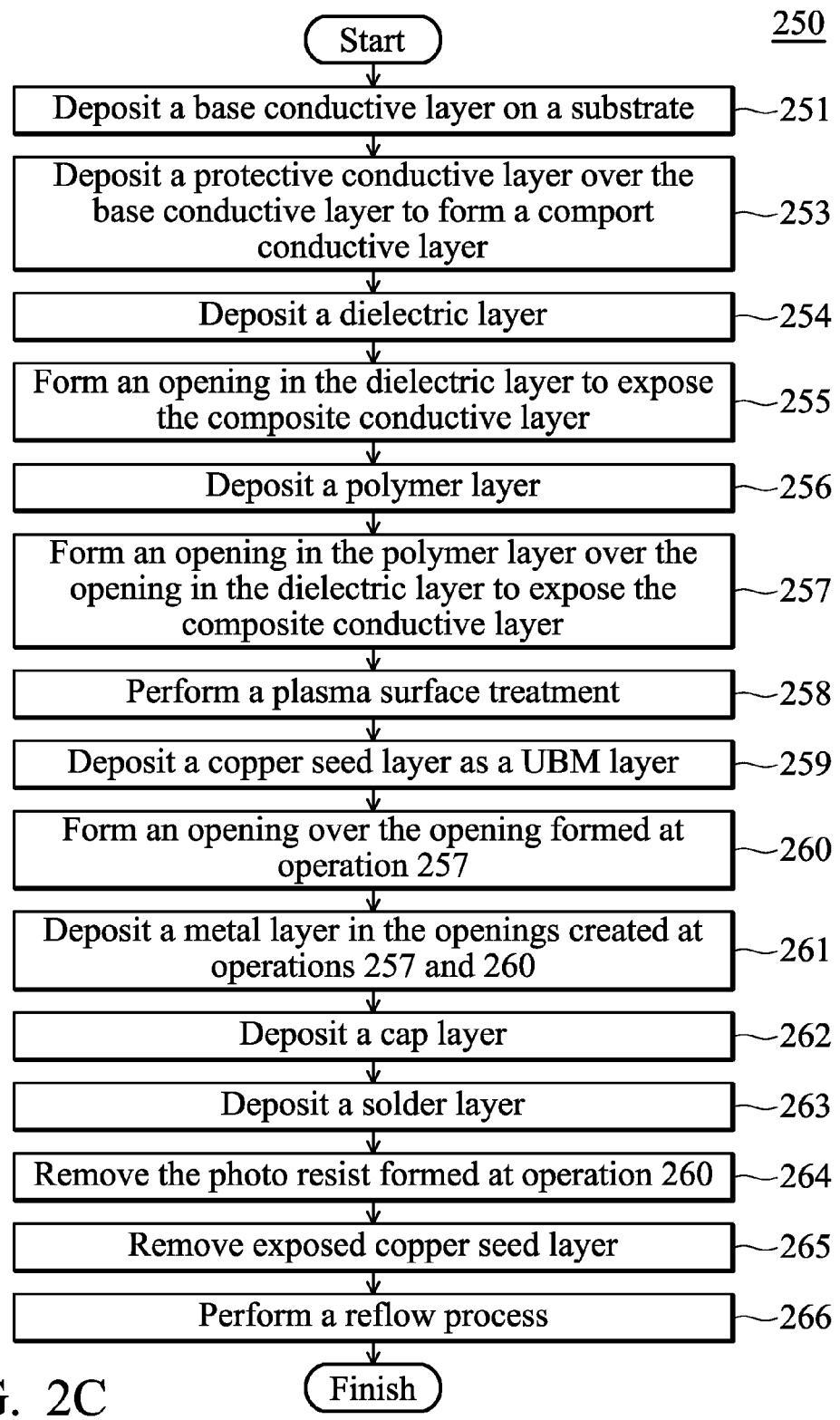
FIG. 2C shows a process flow of forming a Cu pillar bump on a conductive layer without a lower UBM layer as shown in FIG. 2B, in accordance with some embodiments.

FIG. 2C shows a process flow 250 of forming a Cu pillar bump on a conductive layer without the lower UBM layer as shown in FIG. 2B, in accordance with some embodiments. In some embodiments, the conductive layer functions as a power line or a re-distribution line (RDL). In some other embodiments, the conductive layer is a metal pad. Yet in some other embodiments, the conductive layer is a PPI. At operation 251, a base conductive layer is deposited on a substrate. Before operation 251, the substrate has undergone other process operations, such as those described in FIG. 1A, to create devices on the substrate and interconnects. In some embodiments, the thickness of the base conductive layer is between about 1000 Å to about 10,000 Å. After the deposition of the base conductive layer, a protective conductive layer is deposited at operation 253. The protective conductive layer has a thickness between about 500 Å to about 2,000 Å, in some embodiments. As mentioned above, the protective conductive layer is deposited in the same chamber or a different chamber of the same system used to deposit the base conductive layer. If a different chamber is used to deposit the conductive protective layer, the chamber should be connected to the chamber used to deposit the base conductive layer to allow the substrate being transferred from the base conductive layer deposition chamber to the protective conductive layer deposition chamber without breaking vacuum to limit (or prevent) exposure to the environment (or air, or oxygen). The base conductive layer and the protective conductive layer form a composite conductive layer.

In some embodiments, the composite conductive layer is patterned and a dielectric material is used to fill the space between the patterned structures of the composite conductive layer. In some other embodiments, the composite conductive layer fills openings on the substrate and the composite conductive layer outside the openings are removed, such as by one or more chemical-mechanical planarization (CMP) processes. Afterward the formation of the composite conductive layer, a dielectric layer is deposited at operation 254. The dielectric layer has a thickness between about 500 Å to about 10,000 Å, in some embodiments. As mentioned above, the dielectric layer may also be referred to as an isolation layer or a passivation layer. Following operation 254, the dielectric layer is patterned and etched to create (or define, or form) an opening in the dielectric layer to expose the composite dielectric layer underneath at operation 255.

Afterwards, a polymer layer is deposited at operation 256, in accordance with some embodiments. The polymer layer is a relatively soft, often organic, dielectric material, and can be made of a material, such as an epoxy, polyimide, benzocyclobutene (BCB), polybenzoxazole (PBO), and the like. As described above, the polymer layer should adhere well with Cu. In some embodiments, the polymer material is made of poly(4,4'-oxydiphthalic anhydride-1,3-aminophenoxybenzene-8-azaadenine) (ODPA-APB-8-azaadenine). The polymer later has a thickness between about 500 Å to about 10,000 Å, in some embodiments.

Following the deposition of the polymer layer, the substrate is patterned and etched to create (or define, or form) an opening(s) to expose the composite conductive layer at operation 257 in order to form Cu pillar bumps, in some embodiments. Both the polymer layer and the dielectric layer under the openings are etched through to expose the protective layer. After operation 257, a plasma surface treatment is performed at operation 258 on the substrate surface to treat the polymer surface to increase the reactivity of to-be-deposited Cu with the plasma-treated polymer surface. As mentioned above, a plasma containing oxygen, nitrogen, or a combination of both can be used.

After plasma surface treatment of the polymer layer, a copper seed layer (UBM layer $111_U$) is deposited at operation 259, in accordance with embodiments. The copper seed layer has a thickness between about 100 Å to about 10,000 Å, in some embodiments. The copper seed layer comes in direct contact with the protective layer and promotes the growth of copper pillar bumps, which are to be deposited at a later operation. The copper seed layer can be deposited by PVD, CVD (chemical vapor deposition), ALD (atomic layer deposition), or electroless deposition. After the deposition of the copper seed layer, the substrate is patterned to create (or define, or form) an opening for copper deposition at operation 260, in accordance with some embodiments. The photoresist can be dry or wet. In some embodiments, the opening patterned at operation 260 is over and larger than the openings created at operation 257, as shown in FIG. 2B.

At operation 261, a metal layer, such as Cu, is deposited in the openings created in operations 260 and 257. In some embodiments, the copper film is deposited by electrochemical plating (ECP) or electroless plating. Other deposition methods are also applicable. Following the deposition of the copper layer, a cap layer, such as Ni, or other materials mentioned above, is deposited at operation 262 in accordance with some embodiments. In some embodiments, the cap layer is deposited by ECP or electroless plating. A solder layer is deposited over the cap layer at operation 263 in accordance with some embodiments. As mentioned above, the solder layer may be lead-free or may contain lead.

Figure 2D:
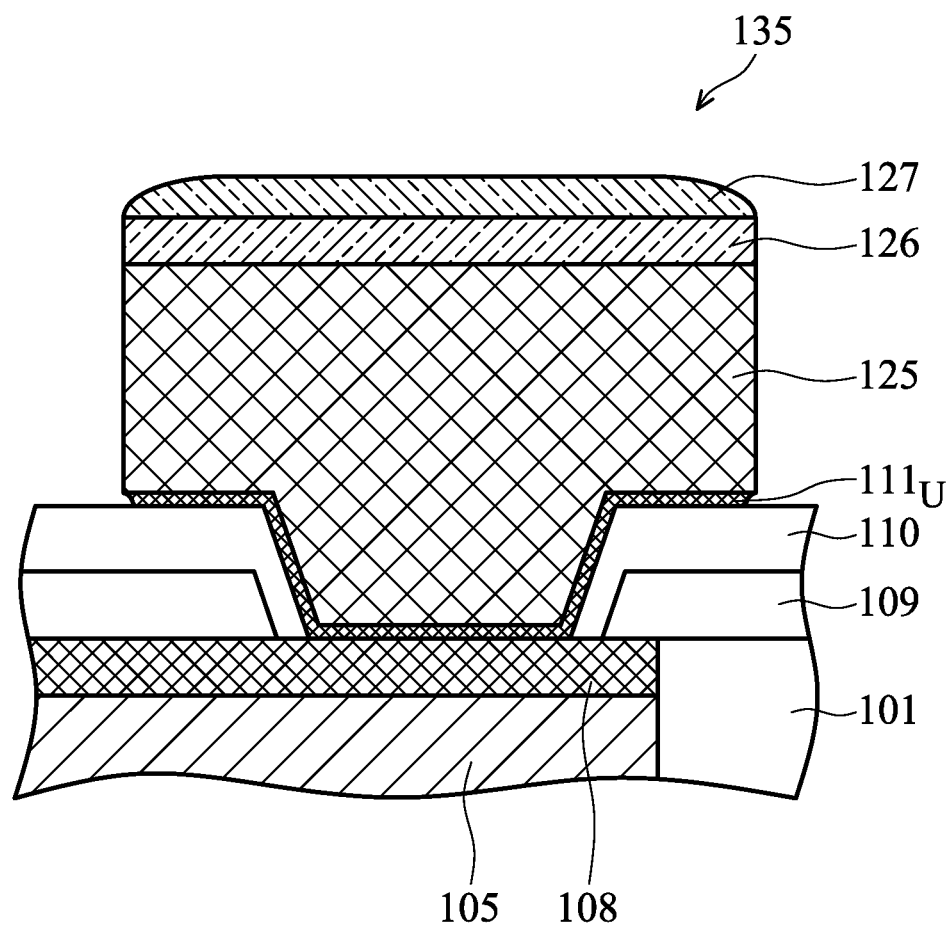
FIG. 2D shows the structure of FIG. 2B after the substrate is reflowed, in accordance with some embodiments.

Afterwards, the photoresist (formed at operation 260) is removed at operation 264. At next operation 265, the exposed copper seed layer (not covered by copper pillar) is etched (or removed). At the end of operation 265 a Cu pillar bump is formed and the Cu pillar bump comes in contact with the composite conductive layer. In some embodiments, a reflow operation 266 is performed after operation 265 to make the shape of the lead-free solder layer rounded on the corner(s), as shown in FIG. 2D.

Figure 3A:
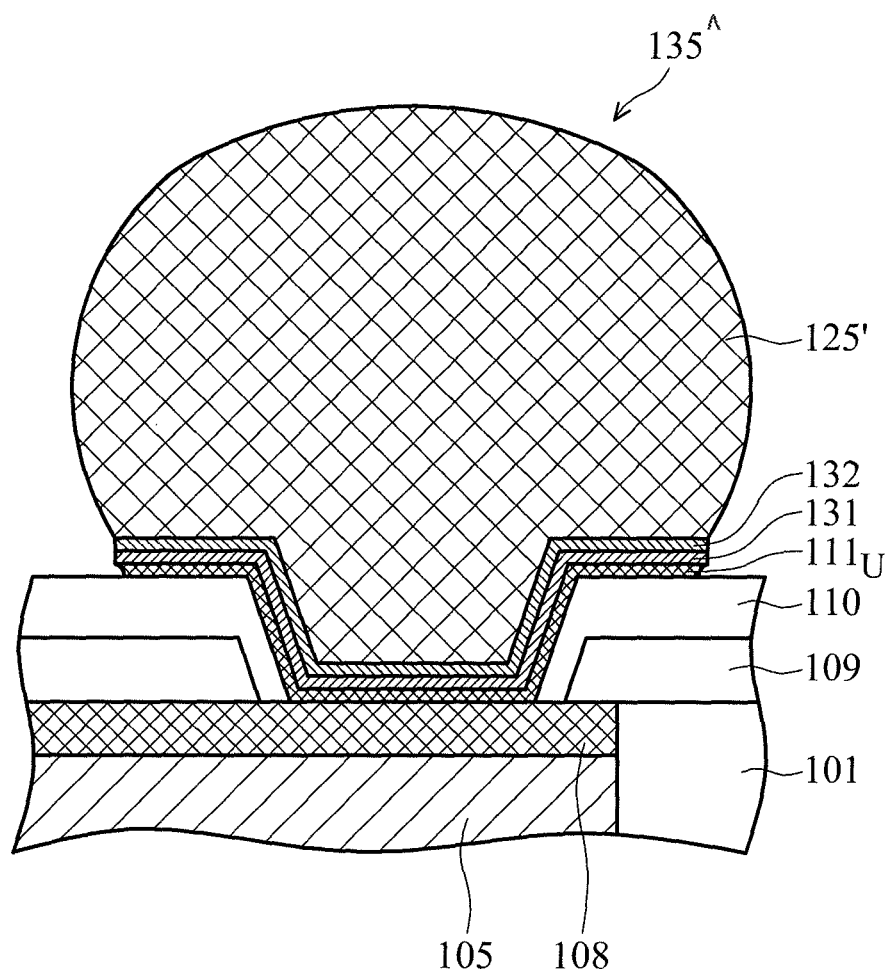
FIG. 3A shows a cross-sectional view of a solder bump structure on a substrate, in accordance with some embodiments.

As described in FIG. 1C, solder may be used as a material for the metal layer 125'. Under the solder metal layer 125', there is a copper layer 131 and a copper diffusing barrier Ni layer 132. The copper layer 131 is deposited directly over the UBM layer 111. Based on the arguments above, a protective conductive layer 108 can also be deposited over the base conductive layer 105 to form a composite conductive layer (layer 105+layer 108). As mentioned above, the proactive layer 108 is made of a conductive layer and can be made of materials, such as Ta, TaN, Ti, TiN, or combination thereof. In addition, due to the addition of the protective layer 108, the UBM layer 111 can be simplified to be a copper layer (or upper UBM layer $111_U$), in accordance with some embodiments. FIG. 3A shows a cross-sectional view of a solder bump 135^, in accordance with some embodiments. Solder bump 135^ is similar to solder bump 135" of FIG. 1C, with the exception described above and also solder bump 135^ having undergone a reflow process.

Figure 3B:
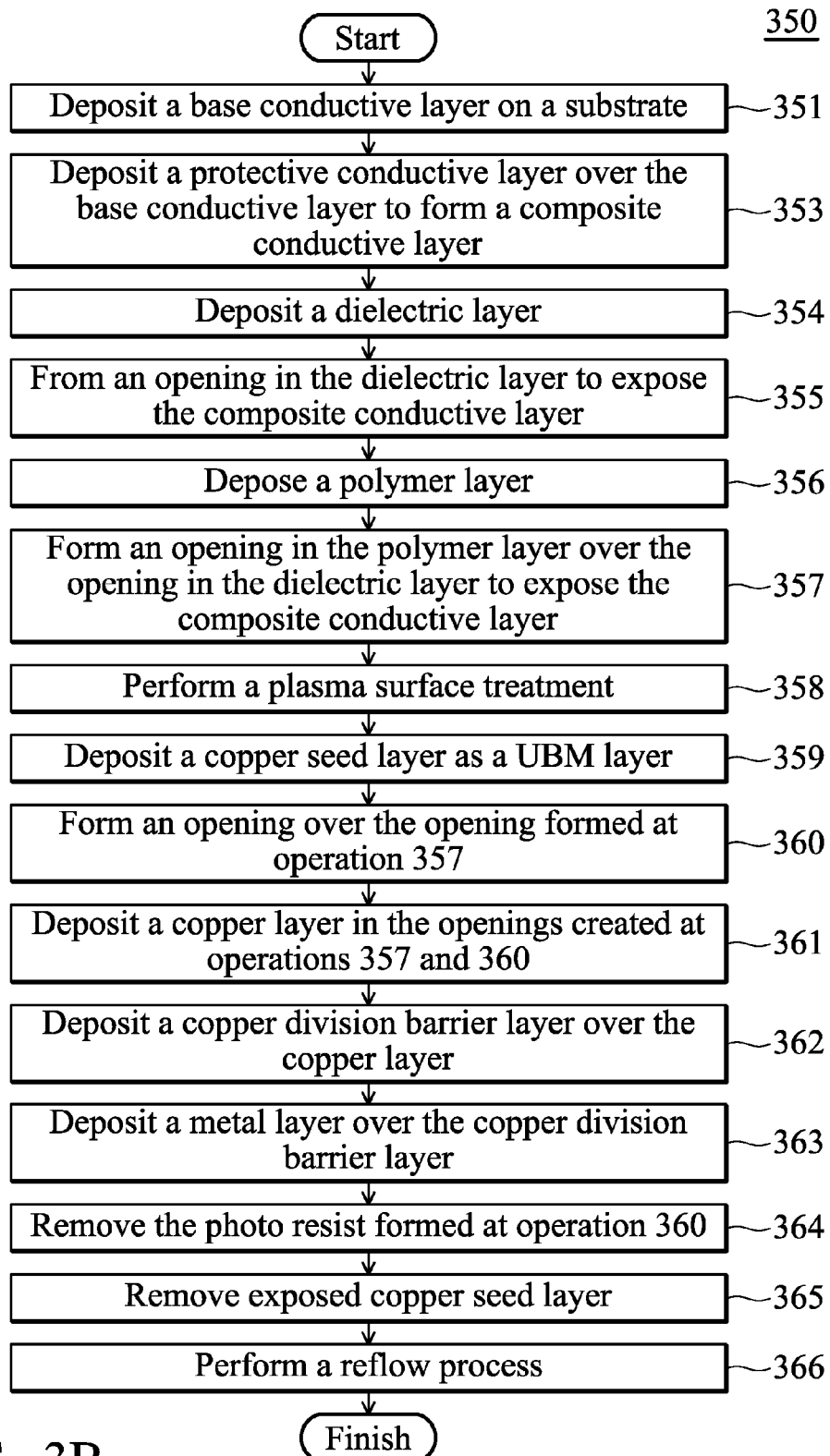
FIG. 3B shows a process flow of making the solder bump structure of FIG. 3A, in accordance with some embodiments.

FIG. 3B shows a process flow 350 of preparing a solder bump shown in FIG. 3A, in accordance with some embodiments. Operations 351-360 are similar to corresponding operations 251-260 of FIG. 2C. After the opening for metal deposition is created, a copper layer (layer 131) is deposited in the opening at operation 361. In some embodiments, the copper layer is deposited by a plating process, which can be an ECP process or an electroless process. As described above for FIG. 1C, the copper layer is to reduce resistivity for the solder bump. Next at operation 362, a copper diffusion barrier layer is deposited. In some embodiments, the copper diffusion barrier layer is deposited by a plating process, which can be an ECP process or an electroless process. Afterwards, at operation 363, a metal layer is deposited over the copper diffusion barrier layer. In some embodiment, the material for the metal layer is solder. In some embodiments, the metal layer is deposited by a plating process, which can be an ECP process or an electroless process. After the metal layer is deposited, the photoresist layer formed at operation 360 is removed. Following the removal of the photoresist layer, the exposed copper seed layer is removed at operation 365, which is similar to operation 265. The substrate is then reflowed to alter the shaped of the metal layer, such as a solder layer, at operation 366. The solder bump in FIG. 3A is reflowed.

Figure 4A:
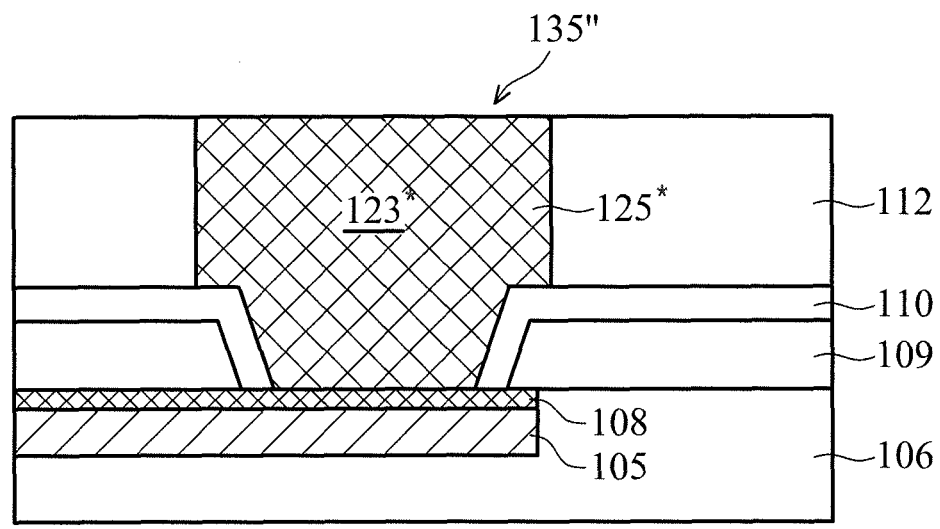
FIG. 4A shows a cross-sectional view of a solder bump structure on a substrate, in accordance with some embodiments.
Figure 4B:
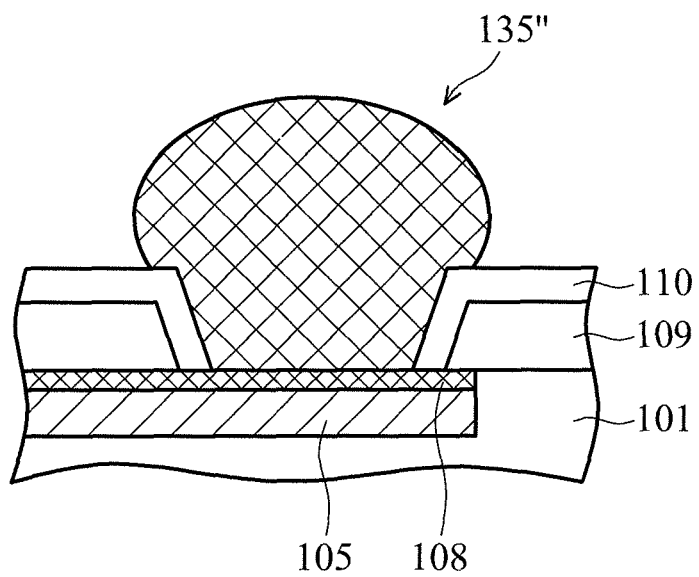
FIG. 4B shows a cross-sectional view of the solder bump structure of FIG. 4A after the photoresist is removed and the substrate is reflowed, in accordance with some embodiments.

In the exemplary embodiments shown in FIGS. 1C and 3A, there is a copper layer 131 under the solder layer 125'. In some embodiments, the copper layer 132 and the copper diffusion layer 132 are not needed. In such embodiments, the UBM layer 111 or 111U is also not needed. However, having the proactive conductive layer 108 over the conductive layer (or base conductive layer) 105 still has the benefit of preventing oxidation of the conductive layer 105 and improving the adhesion with the solder layer 125'. FIG. 4A shows a cross-sectional diagram of a solder bump 135", in accordance with some embodiments. Solder bump 135" is similar to solder bump 135" of FIG. 1C and solder bump 135 of FIG. 3A, without the UBM layer 111, copper layer 131, and copper diffusion layer 132. The solder layer 125* can be applied on the surface of substrate 101 to fill the opening 123* by applying a solder paste on the substrate 101. The solder paste fills the opening 123*. Small amount of solder paste could be left on the surface of photoresist 112; however, the amount is relatively small that its existence does not affect the subsequent removal process of the photoresist 112. FIG. 4B shows the solder bump 135" after the photoresist layer 112 has been removed and also after substrate 101 has undergone a reflow process, in accordance with some embodiments.

Figure 4C:
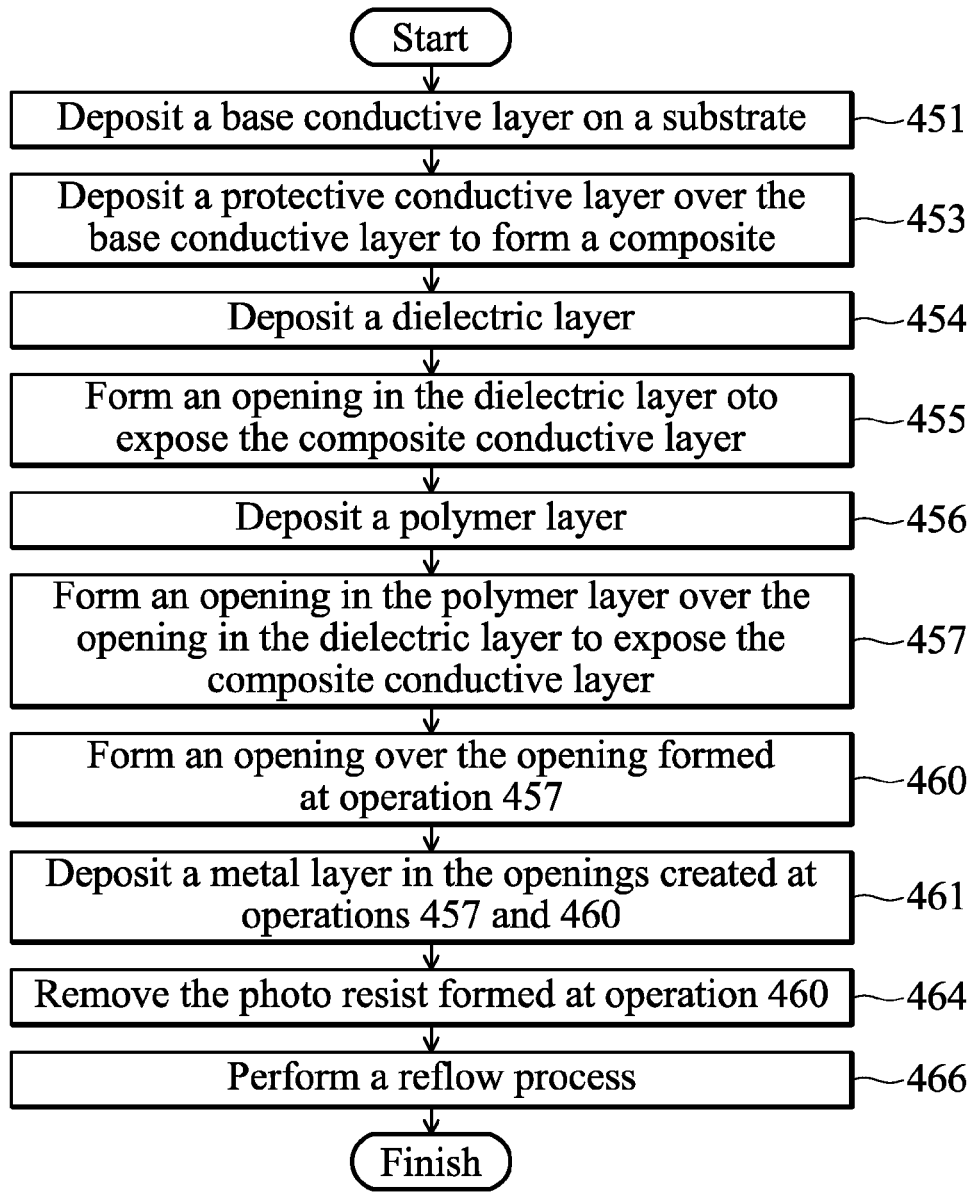
FIG. 4C shows a process flow of making the solder bump structure of FIGS. 4A and 4B, in accordance with some embodiments.

FIG. 4C shows a process flow 450 of preparing a solder bump shown in FIG. 4B, in accordance with some embodiments. Operations 451-457 are similar to corresponding operations 351-357 of FIG. 3B and operations 251-257 of FIG. 2C. Afterwards at operation 460, an opening is formed over the opening formed at operation 457. Following operation 460, a solder metal layer is deposited in the openings created at operation 457 and 460. In some embodiments, the solder metal layer is applied on the substrate surface as a paste with very little solder paste left on the surface of photoresist. Since the solder metal layer is not plated on the substrate, the polymer layer does not need to be plasma-treated. In addition, the choices of materials suitable to be used for the polymer layer are increased. Conventional materials used for polymer layer in substrate packaging can be used. Afterwards, the photoresist layer is removed at operation 464 and the substrate (or the solder bump) is reflowed at operation 465.

The mechanism of forming a metal bump structure described above resolves the delamination issues between a conductive layer on a substrate and a metal bump connected to the conductive layer. The conductive layer can be a metal pad, a post passivation interconnect (PPI) layer, or a top metal layer. By performing an in-situ deposition of a protective conductive layer over the conductive layer (or base conductive layer), the under bump metallurgy (UBM) layer of the metal bump adheres better to the conductive layer and reduces the occurrence of interfacial delamination. In some embodiments, a copper diffusion barrier sub-layer in the UBM layer can be removed, since the protective conductive layer is also a copper diffusion barrier. In these embodiments, a polymer, such as a polyimide, that adheres well with copper is used. In addition, a surface plasma treatment could be needed to create a copper diffusion barrier layer on the surface of the polymer. In some other embodiments, the UBM layer is not needed if the metal bump is deposited by a non-plating process and the metal bump is not made of copper.

In one embodiment, a bump structure on a substrate is provided. The bump structure includes a composite conductive layer on the substrate, and the composite conductive layer includes a protective conductive layer over a base conductive layer. The protective conductive layer and the base conductive layer are deposited in a system to prevent the oxidation of the base conductive layer. The composite conductive layer is made of a material less likely to be oxidized in presence of air or water than a material for the base conductive layer. The bump structure also includes a dielectric layer over the composite conductive layer, and a polymer layer over the dielectric layer. The bump structure further includes a metal bump, and the metal bump fills a second opening of a photoresist layer. The second opening is formed above a first opening created in the polymer layer to make contact with the protective conductive layer of the composite conductive layer, and the metal bump forms a strong bonding with the protective conductive layer.

In another embodiment, a bump structure on a substrate is provided. The bump structure includes a composite conductive layer on the substrate, and the composite conductive layer includes a protective conductive layer over a base conductive layer. The protective conductive layer and the base conductive layer are deposited in a system to prevent the oxidation of the base conductive layer, and the composite conductive layer is made of a material less likely to be oxidized in presence of air or water than a material for the base conductive layer. The bump structure also includes a dielectric layer over the composite conductive layer and a polymer layer over the dielectric layer. The bump structure further includes a copper bump, wherein the copper bump fills a second opening of a photoresist layer, and the second opening is formed above a first opening created in the polymer layer to make contact with the protective conductive layer of the composite conductive layer. The copper bump includes an under bump metallurgy (UBM) layer lining a surface of the first opening and an interface between the polymer layer and the photoresist layer, and the UBM layer forms a strong bonding with the protective conductive layer.

In yet another embodiment, a method of preparing a bump structure on a substrate is provided. The method includes forming a composite conductive layer on the substrate, and the composite conductive layer includes a base conductive layer and a protective conductive layer. The protective conductive layer is deposited right after the base conductive layer without exposing the substrate to air or water. The method also includes depositing a dielectric layer over the composite conductive layer and depositing a polymer layer over the dielectric layer. The method further includes forming a first opening for a copper pillar bump by etching through the dielectric layer and the polymer layer, and depositing an under bump metallurgy (UBM) layer. The UBM layer includes a copper seed layer. In addition, the method includes forming a photoresist pattern on the substrate, and the photoresist has a second opening defined over the first opening. Further, the method includes depositing a metal pillar bump layer, wherein both the UBM layer and the metal pillar bump layer are part of the bump structure.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A bump structure on a substrate, comprising:
   a composite conductive layer embedded in the substrate, wherein the composite conductive layer includes a protective conductive layer over a base conductive layer, and wherein the protective conductive layer is made of a material less likely to be oxidized in presence of air or water than a material for the base conductive layer;
   a dielectric layer over the composite conductive layer, wherein the protective conductive layer positioned to separate the dielectric layer from the base conductive layer;
   a polymer layer over the dielectric layer; and
   a metal bump, wherein the metal bump fills a second opening of a photoresist layer, wherein the second opening is formed above a first opening created in the polymer layer to make contact with the protective conductive layer of the composite conductive layer.

2. The bump structure of claim 1, wherein an under bump metallurgy (UBM) layer lines a surface of the first opening and an interface between the polymer layer and the photoresist layer and wherein the UBM layer is part of the metal bump.

3. The bump structure of claim 2, wherein the metal bump includes a copper layer, a copper diffusion barrier, and a solder ball, and wherein the UBM layer includes a copper seed layer.

4. The bump structure of claim 2, wherein the UBM layer includes a diffusion barrier layer and a copper seed layer.

5. The bump structure of claim 2, wherein the metal bump includes a copper pillar formed by plating and the UBM layer includes a copper seed layer.

6. The bump structure of claim 5 wherein the metal bump further includes a cap layer over the copper pillar, and a solder layer over the cap layer.

7. The bump structure of claim 6, wherein the copper pillar is made of copper or copper alloy, and wherein the cap layer is made of a material selected from the group consisting of nickel, tin, tin-lead, gold, silver, palladium, indium, nickel-palladium-gold, nickel-gold, and other alloys of the above-mentioned materials, and wherein the solder layer is lead-free or contains lead.

8. The bump structure of claim 1, wherein the metal bump includes a solder ball.

9. The bump structure of claim 1, wherein the protective conductive layer is made of a material selected from the group consisting of Ta, TaN, Ti, TiN, and a combination thereof.

10. The bump structure of claim 1, wherein the protective conductive layer has a thickness in a range between about 1000 Å to about 2,000 Å.

11. The bump structure of claim 1, wherein base conductive layer is made of a material selected from the group consisting of copper, aluminum, and copper alloy.

12. The bump structure of claim 1, wherein the composite conductive layer is a metal pad a post passivation interconnect (PPI), or a top metal layer.

13. The bump structure of claim 1, wherein the polymer layer is made of a material selected from the group consisting of epoxy, polyimide, benzocyclobutene (BCB), and polybenzoxazole (PBO).

14. The bump structure of claim 13, wherein the polyimide is poly(4,4'-oxydiphthalic anhydride-1,3-aminophenoxybenzene-8-azaadenine) (ODPA-APB-8-azaadenine).

15. A bump structure on a substrate, comprising:
    a composite conductive layer embedded in the substrate, wherein the composite conductive layer includes a protective conductive layer over a base conductive layer, and wherein the protective conductive layer is made of a material less likely to be oxidized in presence of air or water than a material for the base conductive layer;
    a dielectric layer over the composite conductive layer;
    a polymer layer over the dielectric layer;
    a copper bump, wherein the copper bump fills a second opening of a photoresist layer, wherein the second opening is formed above a first opening created in the polymer layer to make contact with the protective conductive layer of the composite conductive layer, and wherein the copper bump includes an under bump metallurgy (UBM) layer lining a surface of the first opening and an interface between the polymer layer and the photoresist layer, and the copper bump extends into the first opening.

16. The bump structure of claim 15, wherein the UBM layer is a copper seed layer.

17. The bump structure of claim 15, wherein the protective conductive layer is made of a material selected from the group consisting of Ta, TaN, Ti, TiN, and a combination thereof, and wherein the protective conductive layer has a thickness between about 1000 Å to about 2,000 Å.

18. The bump structure of claim 15, wherein the base conductive metal layer is made of a material selected from the group consisting of copper, aluminum, and copper alloy.

19. An integrated circuit device, comprising:
    a substrate;
    a composite conductive layer embedded in the substrate, the composite conductive layer comprising:
      a base conductive layer; and
      a protective conductive layer over the base conductive layer, the protective conductive layer having a characteristic of oxidation rate slower than that of the base conductive layer in presence of air or water;
    a dielectric layer over the composite conductive layer and having a first opening defined therein to expose a first portion of an upper surface of the protective conductive layer;
    a polymer over the dielectric layer and having a second opening defined therein to expose a second portion of the upper surface of the protective conductive layer, the second portion being smaller than the first portion; and
    a bump structure at least partially in the second opening, the bump structure being positioned over the polymer layer and the exposed second portion of the upper surface of the protective conductive layer.

20. The integrated circuit device of claim 19, wherein the bump structure comprises a solder bump directly on the exposed portion of the upper surface of the protective conductive layer.

21. The integrated circuit device of claim 19, wherein the bump structure comprises an under bump metallurgy (UBM) layer over the exposed second portion of the upper surface of the protective conductive layer.

22. The integrated circuit device of claim 19, wherein the bump structure further comprises a copper pillar over the UBM layer.

23. The integrated circuit device of claim 19, wherein the protective conductive layer is made of a material selected from the group consisting of Ta, TaN, Ti, TiN, and a combination thereof.

24. The integrated circuit device of claim 19, wherein the protective conductive layer has a thickness ranging from 1000 Å to about 2,000 Å.

25. The integrated circuit device of claim 19, wherein the bump structure comprises:
- a metal layer having sidewalls positioned above the opening;
- a cap layer over the metal layer; and
- a solder layer over the cap layer.

* * * * *